(12) United States Patent
Chih

(10) Patent No.: US 6,603,645 B2
(45) Date of Patent: Aug. 5, 2003

(54) SOURCE LINE HIGH VOLTAGE DRIVER CIRCUIT WITH IMPROVED RELIABILITY AND READ PERFORMANCE

(75) Inventor: Yue-Der Chih, Hsin-Chu (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 26 days.

(21) Appl. No.: 10/029,484

(22) Filed: Dec. 20, 2001

(65) Prior Publication Data

US 2003/0117756 A1 Jun. 26, 2003

(51) Int. Cl.[7] ................................................ H02H 3/20
(52) U.S. Cl. ....................................................... 361/41.1
(58) Field of Search ........................ 361/90, 91.1, 91.5; 323/313, 315; 330/310, 311

(56) References Cited

U.S. PATENT DOCUMENTS

| | | | |
|---|---|---|---|
| 4,706,038 A | * | 11/1987 | Navidi et al. |
| 5,132,933 A | * | 7/1992 | Schreck et al. |
| 5,572,415 A | * | 11/1996 | Mohan |
| 5,612,613 A | * | 3/1997 | Dutt et al. |

* cited by examiner

Primary Examiner—Edward H. Tso
(74) Attorney, Agent, or Firm—Tung & Associates

(57) ABSTRACT

A source line high voltage driver circuit 50 for use with a semiconductor memory device which has several other substantially identical circuits 50. Circuit 50 includes a latching circuit portion which selectively applies a high voltage signal to source line SL during a write/program cycle, and a cascode circuit which is used to discharge source line SL and which is formed by two transistors 72, 74. The drain terminal of transistor 72 is coupled to source line SL, and the source terminal of transistor 74 is coupled to ground. The drain terminal of transistor 74 and the source terminal of transistor 72 are each coupled to a node N5 which is electrically coupled to the node N5 of every other circuit 50 within the semiconductor memory device.

19 Claims, 3 Drawing Sheets

SOURCE LINE HIGH VOLTAGE DRIVER CIRCUIT WITH IMPROVED RELIABILITY AND READ PERFORMANCE

FIELD OF THE INVENTION

This invention relates to a source line high voltage driver circuit and more particularly, to a source line high voltage driver circuit for a semiconductor memory device having improved reliability and read performance relative to prior high voltage driver circuits.

BACKGROUND OF THE INVENTION

Semiconductor memory devices typically include several memory cells, each having a control gate, a floating gate for storing electrical charge, effective to allow the cells to be programmed, a drain terminal and a source terminal.

In a conventional memory device, a word line is connected to the respective control gates of the memory cells, a bit line is coupled to the respective drain terminals of the memory cells, and a source line is coupled to the respective source terminals of the memory cells. Driver circuits are employed to selectively drive and/or place different voltages on the various lines in order to perform reading and programming or writing functions.

One type of driving circuit, commonly referred to as a high voltage source line driver, is used to drive a source line during read and program/write functions. For example and without limitation, this type of circuit connects the source line to a relatively high voltage (e.g., ten volts) during program erase functions. The circuit must, however, also be capable of providing read functions. Prior source line driver circuits typically include a convention latching circuit employing p-type and n-type metal-oxide-semiconductor ("MOS") transistors. One problem with these conventional source line driver circuits is that the relatively high voltage received, supplied and discharged by the circuit during program cycles can damage the transistors of the circuit over time.

Efforts have been made to include additional transistors within these source line driver circuits in order to isolate the high voltage encountered during program erase cycles to avoid damage to the circuit. One of these prior source line driver circuits utilizes a pair of nMOS transistors arranged in a cascode structure to provide protection to the circuit.

Referring now to FIG. 1, there is shown a schematic diagram illustrating a source line high voltage activated driver circuit 10 which utilizes a cascode structure to avoid damage to the circuit 10. Particularly, circuit 10 includes high voltage nMOS transistors M1 and M2 which are arranged in a serial cascode structure. When a program erase function is desired, signal lines WL and PROG are set "high" (i.e., set to a voltage representing a positive logic value), thereby activating transistors 1 and 2 and causing node N0 to be "low" (i.e., to have a voltage representing a negative logic value). As a result, p-type MOS transistor P1 is activated and the high voltage signal (e.g., approximately ten volts) at the source of transistor P1 is communicated to node N1 and source line SL. Program line PROG_L is set low and the serial cascode structure of transistors M1 and M2 provide isolation to transistors M3 and MN from the high voltage signal, thereby avoiding damage to the circuit 10 and improving the reliability of circuit 10 relative to prior source line driver circuits.

However, the circuit 10 suffers from some drawbacks. During a read function, source line SL must be discharged and connected to ground (i.e., the high voltage at node N1 must be discharged to ground). Particularly, during a read cycle, signal line PROG_L is set high, the sources of p-type transistors P1 and P2 are coupled to a predetermined voltage (Vcc), and the existing voltage at node N1 is discharged through the series cascode structure M1, M2 along discharge path 12. In the read cycle, if M1, M2 is small, the resulting conduction is relatively poor, thus the effective cell current will be small and the read performance will be worse. Because transistors M1 and M2 are relatively large and are connected in series, the conduction between source line SL and ground is decreased, and the read performance of circuit 10 is degraded. Furthermore, due to the large number of driver circuits in a typical semiconductor memory device, the increased size of the circuit undesirably and significantly increases the overall size of the device.

There is therefore a need for a new and improved source line high voltage driver circuit having improved durability relative to prior circuits, while maintaining and/or improving the read performance of the circuit.

SUMMARY OF THE INVENTION

A first non-limiting advantage of the invention is that it provides a source line high voltage driver circuit which has improved durability and read performance relative to prior circuits of the same size.

A second non-limiting advantage of the invention is that it provides a source line high voltage driver circuit which has improved conduction between the source line and ground relative to prior circuits.

According to a first aspect of the present invention, a source line driver circuit is provided and includes a source line, a first circuit portion which is electrically coupled to the source line and which is effective to selectively provide a high voltage signal to the source line during a write cycle; and a cascode circuit portion which is electrically coupled to the source line and which includes a first transistor, and a plurality of second transistors which are disposed in a parallel relationship to each other, the cascode circuit portion being effective to selectively "ground the source" during a read cycle.

According to a second aspect of the present invention, a high voltage source line driver circuit is provided. The circuit includes a latching circuit which selectively provides a high voltage signal to the source line during a write cycle; a cascode circuit which is coupled to the source line and which includes a first transistor which is coupled to the source line and which includes a first gate, a second transistor which is coupled to the first transistor and which includes a second gate, and a plurality of third transistors which are disposed in parallel with the second transistor; and at least one control signal which is coupled to the first and second gates and which is effective to selectively activate the first and second transistors during a read cycle, thereby discharging the source line.

According to a third aspect of the present invention, a method of driving a plurality of source lines within a memory device is provided. The method includes the steps of: providing a plurality of latching circuits for selectively applying a high voltage to the plurality of source lines; providing a plurality of cascode circuits which are each coupled to a unique one of the plurality of source lines, and which each includes a first transistor and a second transistor which are selectively activated to selectively discharge the plurality of source lines; and electrically coupling each of the second transistors together in a parallel relationship, thereby causing the second transistors to form a virtual ground potential.

These and other features, advantages, and objects of the invention will become apparent by reference to the following specification and by reference to the following drawings.

DETAILED DESCRIPTION OF THE PREFERRED EMBODIMENT OF THE INVENTION

Figure 1:
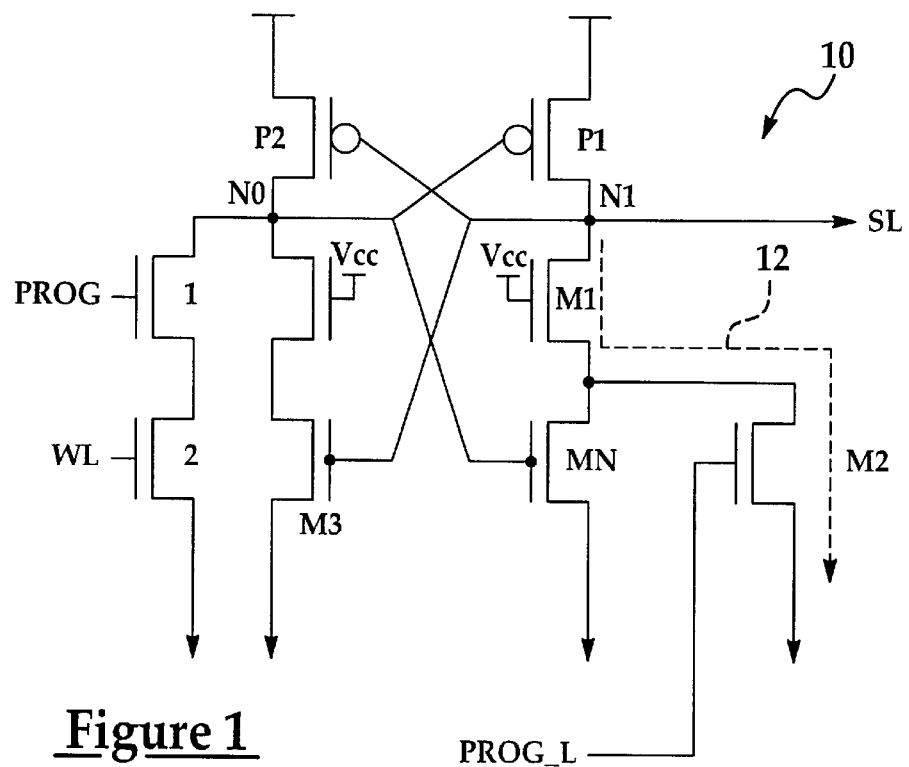
FIG. 1 is a schematic diagram illustrating a source line high voltage driver circuit which is made in accordance with the teachings of the prior art.
Figure 2:
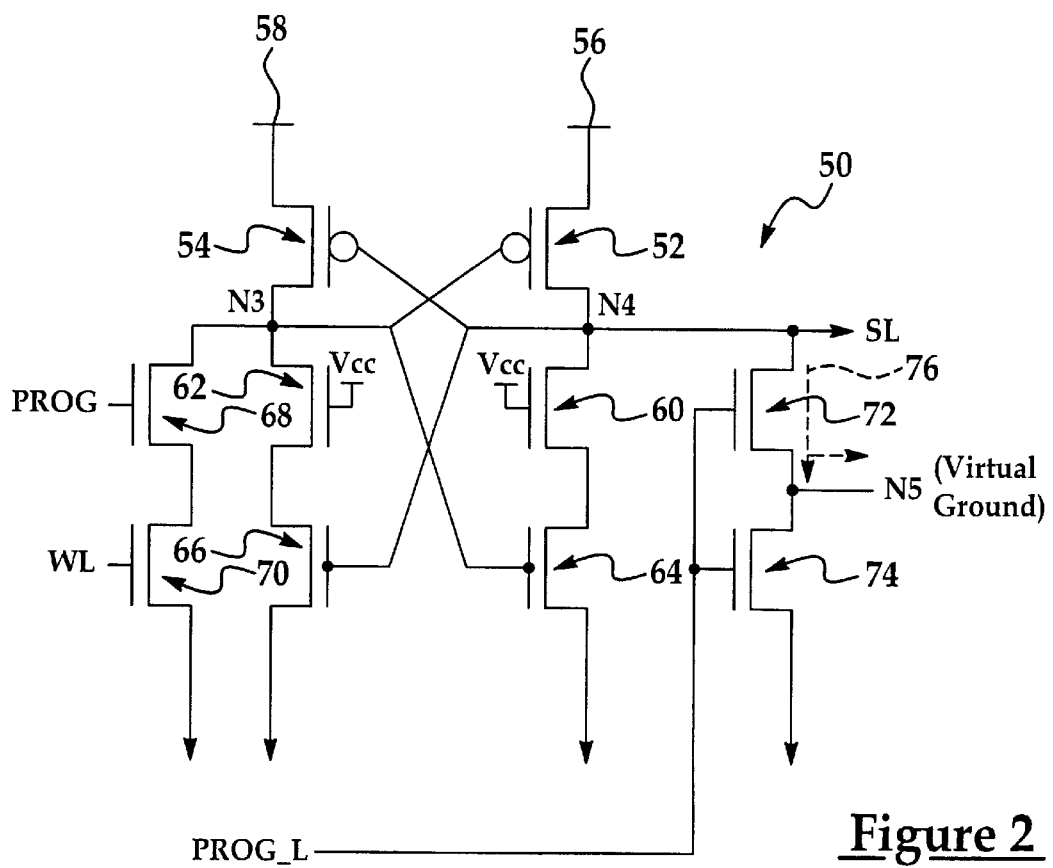
FIG. 2 is a schematic diagram illustrating a source line high voltage driver circuit which is made in accordance with the teachings of a first embodiment of the present invention.

Referring now to FIG. 2, there is shown a source line high voltage driver circuit 50 that is made in accordance with the teachings of the preferred embodiment of the present invention and which is adapted for use within a conventional semiconductor integrated circuit device. It should be appreciated by one of ordinary skill in the art that a semiconductor integrated circuit device may employ several substantially identical source line driver circuits 50 which operate in a cooperative manner to perform various conventional memory functions. Importantly, in such an arrangement, and as discussed more fully and completely below, the nodes N5 of each of the source line driver circuits 50 are electrically coupled together.

In the preferred embodiment, circuit 50 includes a pair of p-type high voltage field effect transistors 52, 54. Transistor 52 includes a control gate which is electrically and communicatively coupled to node N3, a source terminal which is coupled to a selectively controlled voltage signal 56 (e.g., a high voltage signal or Vcc depending on the operational mode of circuit 50), and a drain which is electrically coupled to node N4. Transistor 54 includes a control gate which is electrically and communicatively coupled to node N4, a source terminal which is coupled to a selectively controlled voltage signal 58, and a drain which is electrically coupled to node N3. In the preferred embodiment of the invention, signal 58 is identical to signal 56 and source terminals of transistors 52, 54 may be coupled together).

Circuit 50 further includes two pairs of n-type field effect transistors 60, 62 and 64, 66. In the preferred embodiment, transistors 60–64 are all high voltage field effect transistors and transistor 66 is a low voltage field effect transistor. The gates of transistors 60, 62 are each coupled to Vcc. The drain terminal of transistor 60 and the gate terminal of transistor 66 are coupled to node N4, which is electrically coupled to the drain of transistor 52, the gate of transistor 54, and the source line SL. The drain terminal of transistor 62 and the gate terminal of transistor 64 are coupled to node N3, which is electrically coupled to the drain of transistor 54, the gate of transistor 52, and the drain of program line "PROG" transistor 68. The gate terminal of transistor 64 is coupled to node N3, which is electrically coupled to the gate terminal of transistor 52, the drain of transistor 54 and the drain of transistor 68. The source terminals of transistors 60, 62 are respectively and electrically coupled to the drain terminals of transistors 64, 66, and the source terminals of transistors 64, 66 are electrically coupled to ground. It should be appreciated by one of ordinary skill in the art, that transistors 52, 54, 60, 62, 64 and 66 cooperatively form a latching circuit (i.e., a full latch circuit formed by a pair of inverters).

In the preferred embodiment, transistor 68 is an n-type field effect transistor, having a gate which is coupled to a first program line signal "PROG", a drain which is coupled to node N3, and a source terminal which is coupled to the drain terminal of write line transistor 70. Transistor 70 is also an n-type field effect transistor, and includes a gate which is coupled to a write line signal "WL", and a source which is coupled to ground.

Circuit 50 further includes transistors 72, 74, which form a cascode circuit that provides a discharge path during read cycles and further assists in isolating and protecting nMOS transistors 64, 66 from damage from the high voltage of the source line SL. Transistor 72 is an n-type high voltage field effect transistor, and transistor 74 is an n-type low voltage field effect transistor. The gate terminals of both transistors 72, 74 are coupled to a second program line signal "PROG_L". The drain of transistor 72 is coupled to source line SL and node N4. The source of transistor 72 and the drain of transistor 74 are each coupled to node N5 which acts as a virtual ground, as explained more fully and completely below. The source of transistor 74 is coupled to ground. It should be appreciated that the exact type of transistors used for circuit 50 is not critical and in alternate embodiments, different types of transistors may be used to form similar latching and cascode circuits having a substantially identical function as those of circuit 50.

As previously discussed, circuit 50 is one of a multitude of substantially identical source line driver circuits which are disposed within a semiconductor memory device and which are used to cooperatively perform certain memory functions (e.g., program, erase, and read functions). The node N5 of each circuit 50 is electrically and mutually coupled to the node N5 of every other source line driver circuit 50 within the memory device, effective to connect each of the respective transistors 74 in a parallel relationship. A typical device may include tens to hundreds of source line driver circuits 50, and thus, node N5 will effectively represent tens to hundreds of transistors 74 in a parallel relationship, effectively and cooperatively creating a virtual ground potential. That is, the parallel relationship between all of the transistors 74 will provide an effective resistance of near zero.

As a result, the conduction path from SL to ground has a lower resistance and Q11 Current during the read cycle is higher as the conductivity between source line SL and ground is significantly improved, thereby improving the read performance of the circuit. The discharging of circuit 50 also occurs with less damage to other circuit components relative to the prior design, in which the transistors of cascode circuit were isolated in a series relationship (e.g., if there is high voltage at node N3 or N4, a cascode structure can prevent damage from happening. Hence, this cascode structure can prevent damage from happening if there is static high voltage on N3 or N4). Moreover, because so many transistors 74 are connected in parallel, the size of the transistors 74 and 72 that are used can be smaller than the size of transistors M1 and M2 of the prior art cascode structure. This size benefit is especially advantageous considering that a semiconductor memory device may include hundreds of circuits 50.

Figure 3:
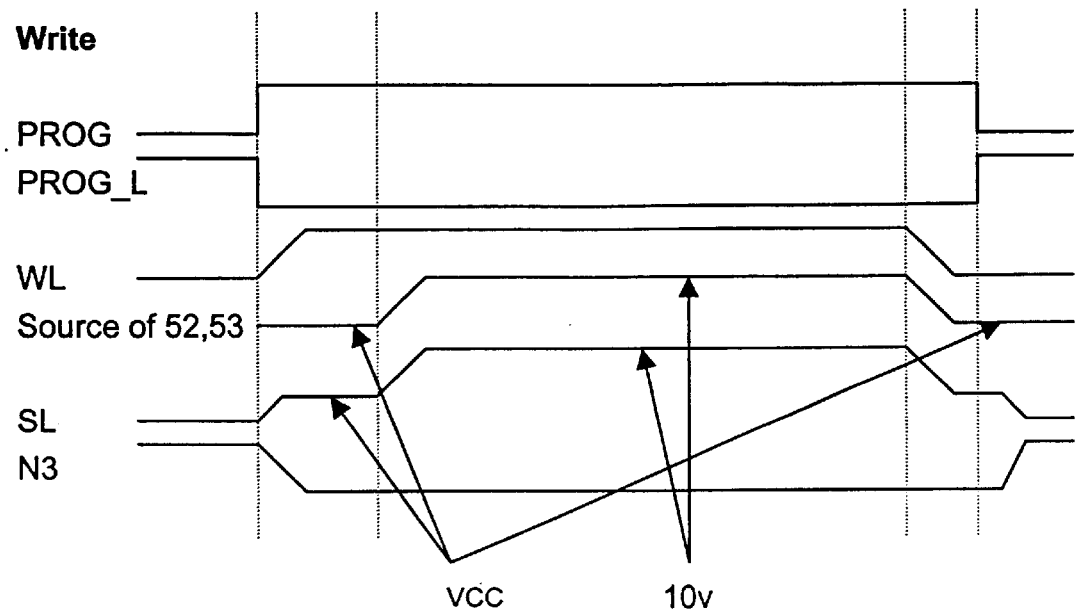
FIG. 3 illustrates graphs of the various voltage signals applied to the circuit shown in FIG. 2 during a write or program cycle and the resulting voltages on node N2 and the source line SL of the circuit.
Figure 4:
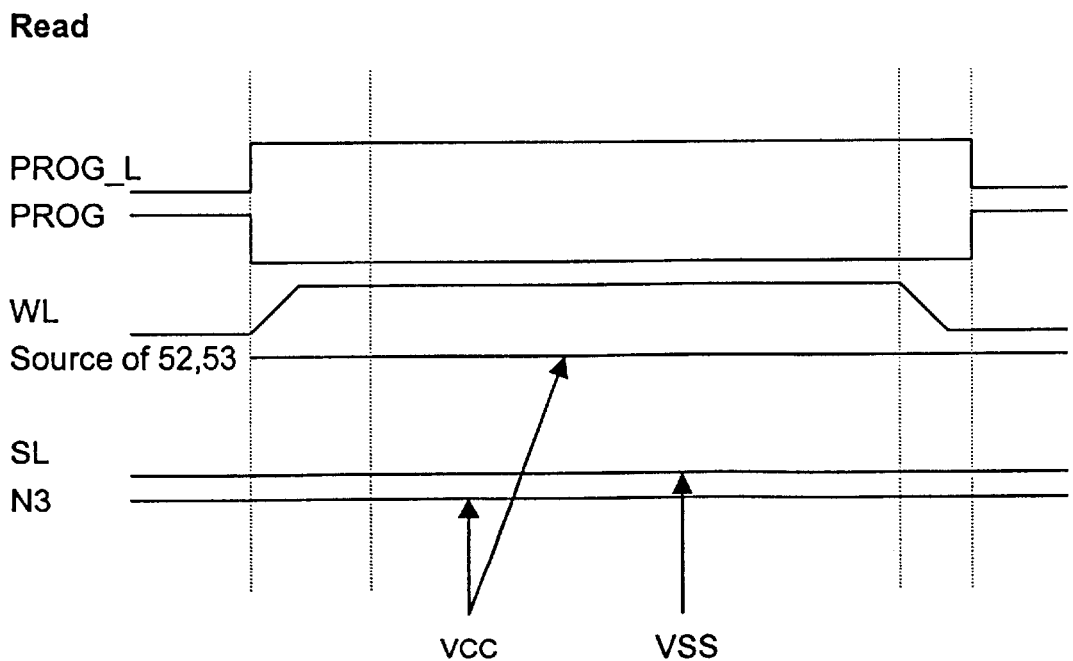
FIG. 4 illustrates graphs of the various voltage signals applied to the circuit shown in FIG. 2 during a read cycle and the resulting voltages on node N2 and the source line SL of the circuit.

In operation, circuit 50 is used to drive source line SL for write and read functions. To best understand the operation of circuit 50, reference is made to FIGS. 3 and 4 which illustrate the values of the signals applied to circuit 50 during write and read functions and the resulting state of source line SL and node N3. First, with reference to FIG. 3, in order to perform a write function, program line PROG and write line WL are set high, thereby activating transistors 68, 70 and driving node N3 low. The low signal at node N3 activates pMOS transistor 52, effective to cause the control voltage signal 56 (e.g., Vcc) to be applied to node N4, thereby driving source line SL to that voltage. After a predetermined period of time, program line PROG is set low and the circuit 50 is latched. At this time, signal 56 may be set to a high voltage (e.g., HV), which in one non-limiting embodiment may equal about ten volts. This high voltage signal is applied to source line SL through node N4. During the write cycle, the second program signal PROG_L remains low.

When a read function is desired, program signal PROG_L is set high, thereby activating transistors 72, 74 and effectively coupling source line SL and node N4 to ground (i.e., virtual ground), and allowing the high voltage on the source line to be efficiently and rapidly discharged along path 76. Once N4 is effectively grounded or low, transistor 54 will be activated, and voltage signal 58 (e.g., Vcc) will be communicated to node N3. This will deactivate transistor 52, and complete the latching process.

Figure 5:
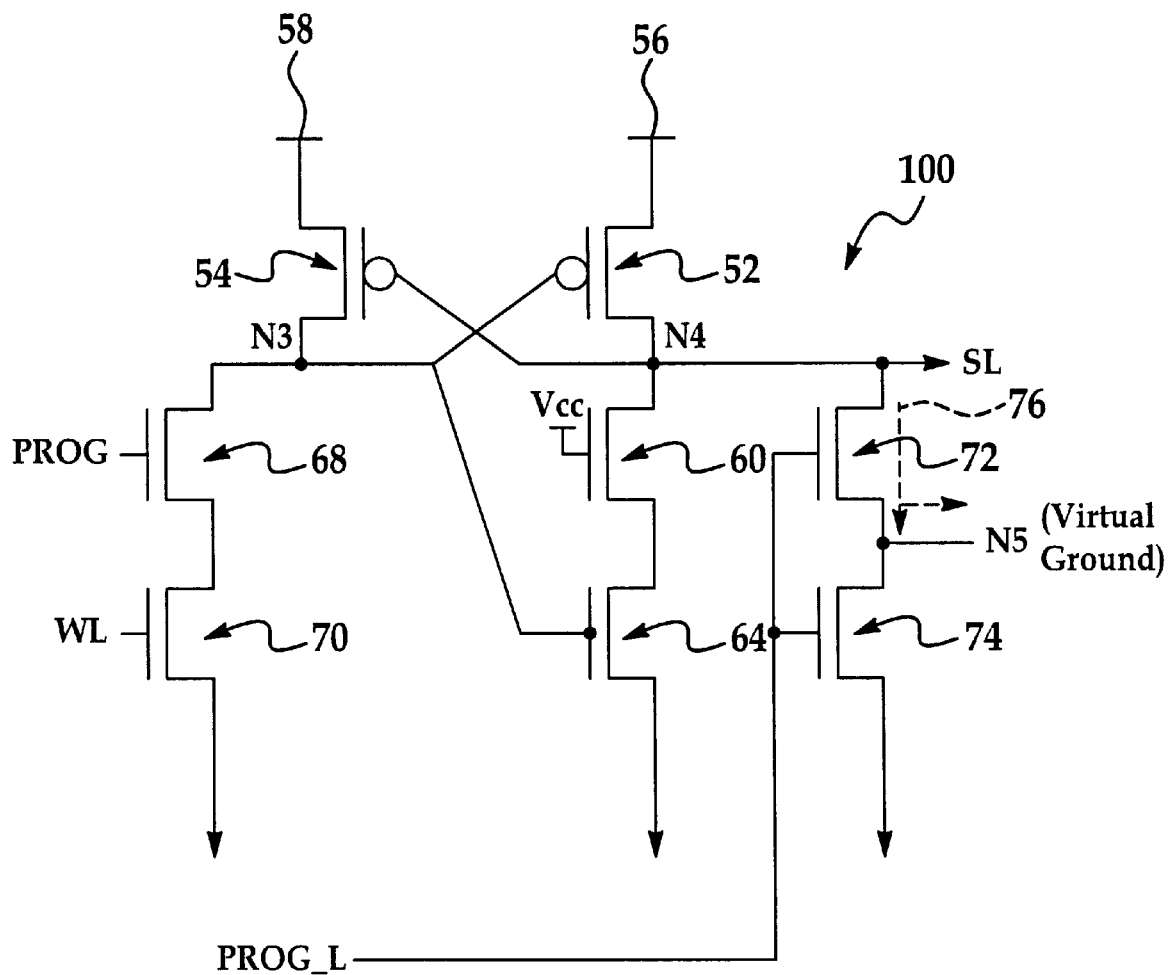
FIG. 5 is a schematic diagram of source line high voltage driver circuit which is made in accordance with the teachings of a second embodiment of the present invention.

Referring now to FIG. 5, there is shown a source line high voltage driver circuit 100 that is made in accordance with the teachings of a second embodiment of the present invention and which is adapted for use within a conventional semiconductor memory device (e.g., a semiconductor device may have tens to hundreds of circuits 100). Circuit 100 is substantially identical to circuit 50 with the exception that transistors 62 and 66 have been removed. This removal of transistors 62, 66 is effective to create a "half-latch" type circuit, which is essentially comprised of an inverter (i.e., transistors 52, 60, 64) and a pMOS return (i.e., transistor 54). The cascode portion of the circuit 50 (i.e., transistors 72, 74) remains identical, and node N5 remains coupled to similar nodes N5 in all other circuits 100 within the semiconductor memory device, thereby creating a virtual ground potential at node N5. Circuit 100 operates in a similar manner to circuit 50, with the exception that during write cycles, program line PROG remains high throughout the write cycle, as the circuit 100 does not have the ability to be "fully latched". During read cycles, program line PROG_L is switched from low to high, thereby allowing the high voltage on source line SL to discharge along path 76 created by the virtual ground at node N5. It should be appreciated that the unique cascode arrangement and parallel arrangement of transistors 74, provide the same advantages as circuit 50 (e.g., improved read performance, reduced size, increased durability).

It should be understood that the inventions described herein are provided by way of example only and that numerous changes, alterations, modifications, and substitutions may be made without departing from the spirit and scope of the inventions as delineated within the following claims.

What is claimed is:

1. A source line driver circuit comprising:
a source line;
a first circuit portion which is electrically coupled to said source line and which is effective to selectively provide a high voltage signal to said source line during a write cycle; and
a cascode circuit portion which is electrically coupled to said source line and which includes a first transistor, and a plurality of second transistors which are disposed in a parallel relationship, said cascode circuit portion being effective to selectively discharge said source line during a read cycle.

2. The source line driver circuit of claim 1 wherein said first circuit portion comprises a full latch type circuit.

3. The source line driver circuit of claim 1 wherein said first circuit portion comprises a half latch type circuit.

4. The source line driver circuit of claim 1 wherein said first circuit portion comprises a latch including at least one p-type field effect transistor having a source which is coupled to said high voltage signal and a drain which is coupled to said source line.

5. The source line driver circuit of claim 4 wherein said p-type field effect transistor further comprises a first gate terminal, and said first circuit portion further includes a n-type field effect transistor having a second gate which is coupled to said first gate.

6. The source line driver circuit of claim 1 wherein said first transistor of said cascode circuit portion comprises a n-type high voltage field effect transistor.

7. The source line driver circuit of claim 6 wherein said plurality of second transistors comprises at least one n-type low voltage field effect transistor.

8. The source line driver circuit of claim 7 wherein said first transistor includes a first drain which is coupled to said source line, a first gate and a first source, and wherein said at least one low voltage field effect transistor comprises a second drain which is coupled to said first source, a second gate and a second source which is coupled to ground, and wherein said first and second gates are coupled to a control signal which is effective to activate the transistors during a read cycle, thereby allowing said source line to discharge.

9. A high voltage source line driver circuit comprising:
a latching circuit which selectively provides a high voltage signal to said source line during a first cycle;
a cascode circuit which is coupled to said source line and which includes a first transistor which is coupled to said source line and which includes a first gate, a second transistor which is coupled to said first transistor and which includes a second gate, and a plurality of third transistors which are disposed in parallel with said second transistor; and
at least one control signal which is coupled to said first and second gates and which is effective to selectively activate said first and second transistors during a second cycle, thereby discharging said source line.

10. The high voltage source line driver circuit of claim 9 wherein said latching circuit comprises a pair of inverters.

11. The high voltage source line driver circuit of claim 9 wherein said latching circuit comprises a half latch including a pMOS return and an inverter.

12. The high voltage source line driver circuit of claim 9 wherein said first transistor of said cascode circuit comprises a high voltage n-type field effect transistor having a drain terminal which is coupled to said source line and a source terminal.

13. The high voltage source line driver circuit of claim 12 wherein said second transistor of said cascode circuit comprises a low voltage n-type field effect transistor having a drain terminal which is coupled to said source terminal of said first transistor and a source terminal which is coupled to ground.

14. The high voltage source line driver circuit of claim 9 wherein said plurality of third transistors are disposed within a plurality of high voltage source line driver circuits contained within a semiconductor memory device.

15. A method of driving a plurality of source lines within a memory device, said method comprising the steps of:

providing a plurality of latching circuits for selectively applying a high voltage to said plurality of source lines;

providing a plurality of cascode circuits which are each coupled to a unique one of said plurality of source lines, and which each includes a first transistor and a second transistor which are selectively activated to selectively discharge said plurality of source lines; and electrically coupling each of said second transistors together in a parallel relationship, thereby causing said second transistors to form a virtual ground potential.

16. The method of claim 15 wherein each of said first transistors comprises a high voltage field effect transistor.

17. The method of claim 15 wherein each of said second transistors comprises a low voltage field effect transistor.

18. The method of claim 15 wherein said first and second transistors are selectively activated during a read cycle.

19. The method of claim 15 wherein said plurality of latching circuits selectively apply a high voltage to said plurality of source lines during a write cycle.

* * * * *